Figure 1:
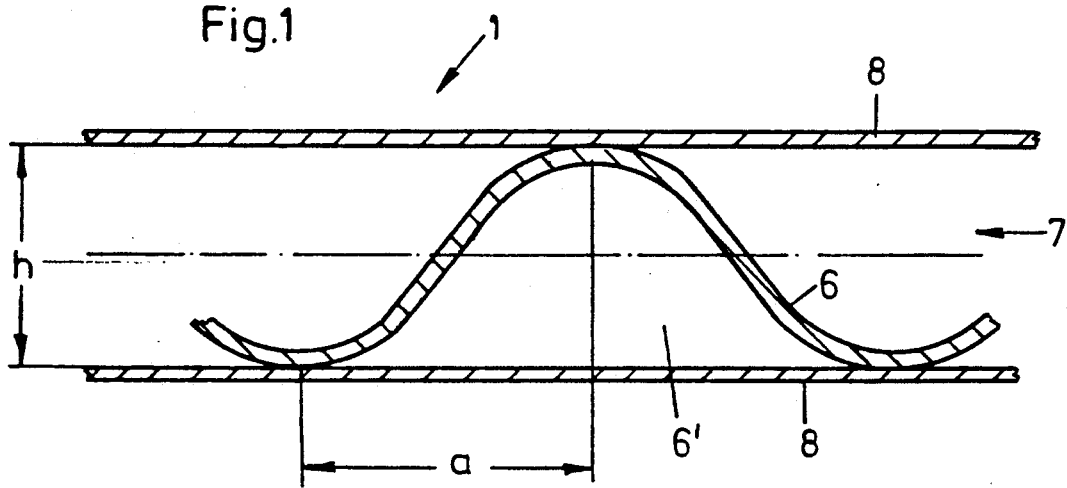
Figure 2:
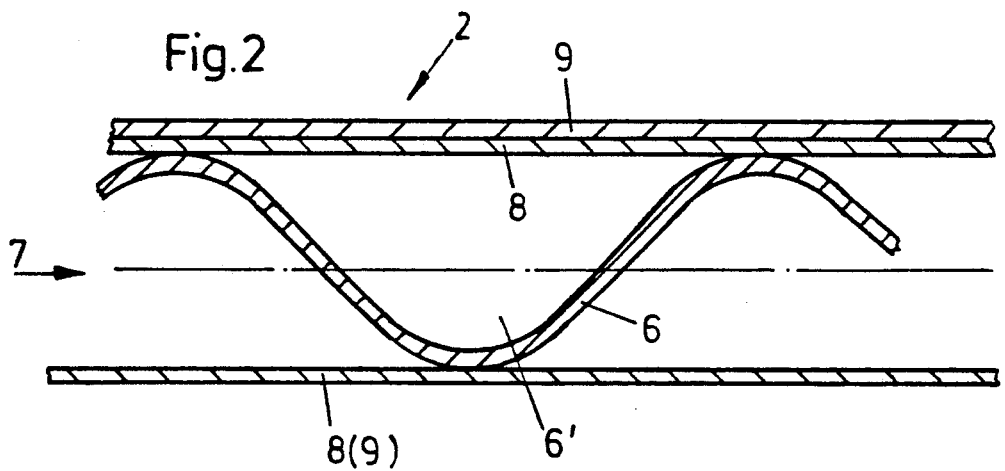

United States Patent [19]

Schulz-Harder

[11] Patent Number: 5,087,505
[45] Date of Patent: Feb. 11, 1992

[54] SUBSTRATE, CONSISTING OF COPPER AND CERAMIC LAYERS, FOR PRINTED CIRCUIT BOARDS OF ELECTRICAL CIRCUITS

[76] Inventor: Jürgen Schulz-Harder, AM Stadtwald 2, D-8489 Eschenbach, Fed. Rep. of Germany

[21] Appl. No.: 510,601

[22] Filed: Apr. 18, 1990

[30] Foreign Application Priority Data

Apr. 21, 1989 [DE] Fed. Rep. of Germany ....... 3913161

[51] Int. Cl.$^5$ .............................................. B32B 9/00
[52] U.S. Cl. ..................... 428/192; 428/209; 428/210; 428/426; 428/433; 428/457; 428/116; 428/174; 428/901; 428/141; 428/152; 361/397
[58] Field of Search ............... 428/209, 210, 426, 433, 428/457, 901, 116, 174, 192, 141, 152; 156/60; 427/96; 361/397

[56] References Cited

U.S. PATENT DOCUMENTS

| | | | |
|---|---|---|---|
| 3,052,749 | 9/1962 | Snapp et al. | 174/68.5 |
| 3,263,023 | 7/1966 | Staley | 174/68.5 |
| 4,450,377 | 5/1984 | Brieve | 310/319 |
| 4,551,357 | 11/1985 | Takeuchi | 427/96 |
| 4,689,442 | 8/1987 | Ozaki | 361/397 |
| 4,842,959 | 6/1989 | Maeda et al. | 428/432 |
| 4,894,271 | 1/1990 | Hani et al. | 428/457 |

Primary Examiner—Patrick J. Ryan
Attorney, Agent, or Firm—Lucas & Just

[57] ABSTRACT

A multilayered substrate for printed circuit boards of electrical circuits, said substrate consisting of copper and ceramic layers which are joined together by the DBC method into said multilayered substrate, with each copper layer being formed by a copper sheet and each ceramic layer being formed by a ceramic plate, at least two of said layers forming a layer sequence having a hollow section or core, said at least two layers being arranged essentially parallel to each other, said at least two layers being spaced apart from one another by an intermediate spacing layer.

13 Claims, 3 Drawing Sheets

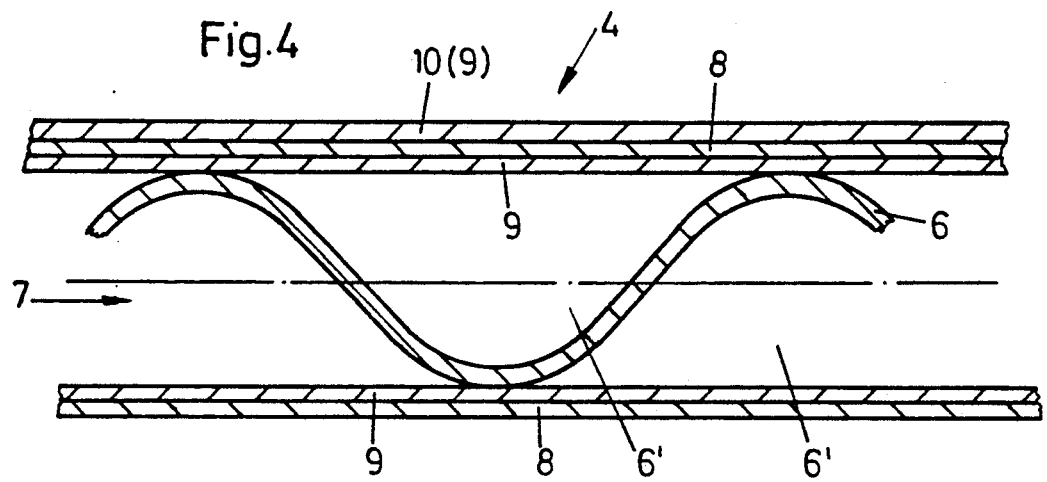
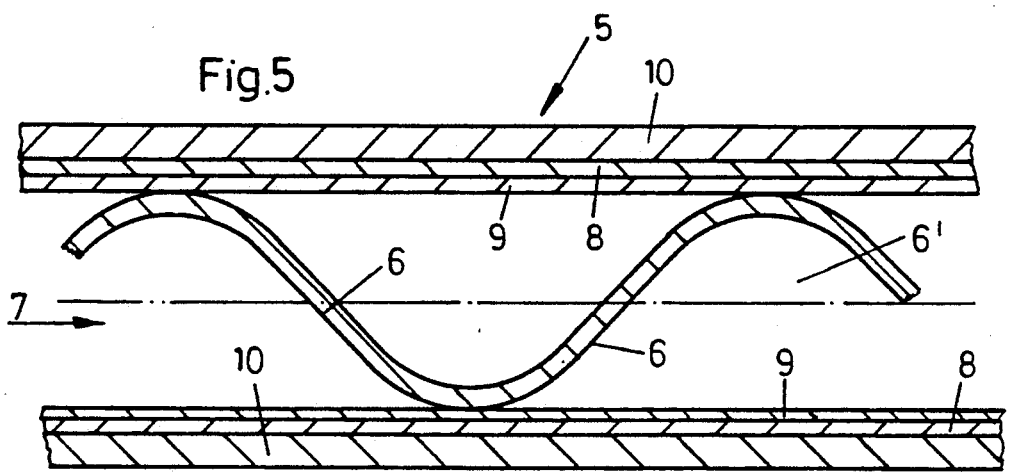
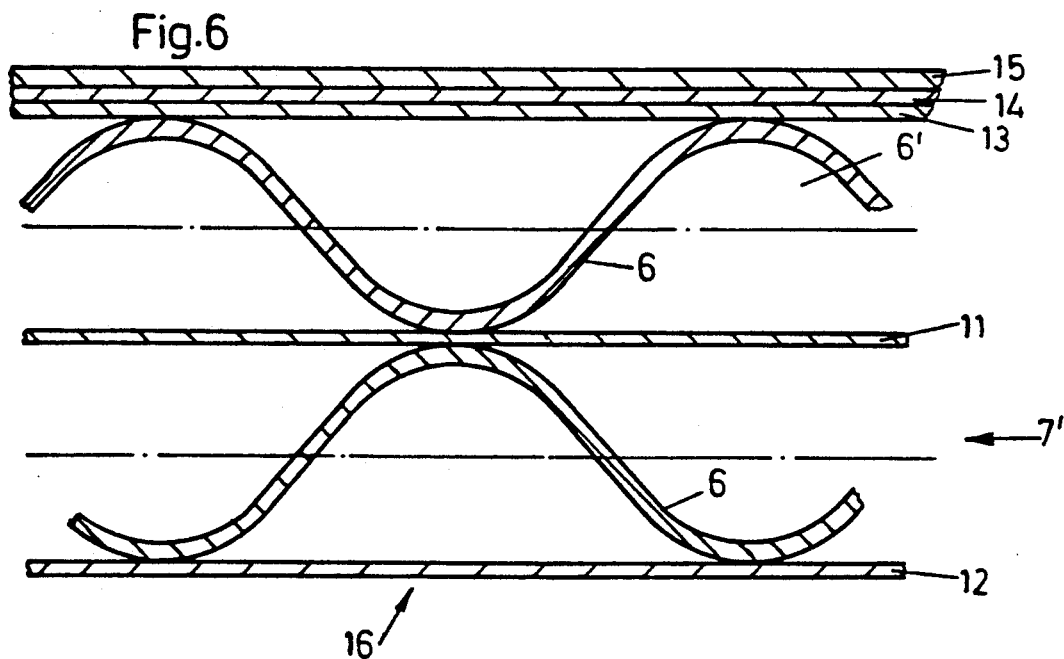

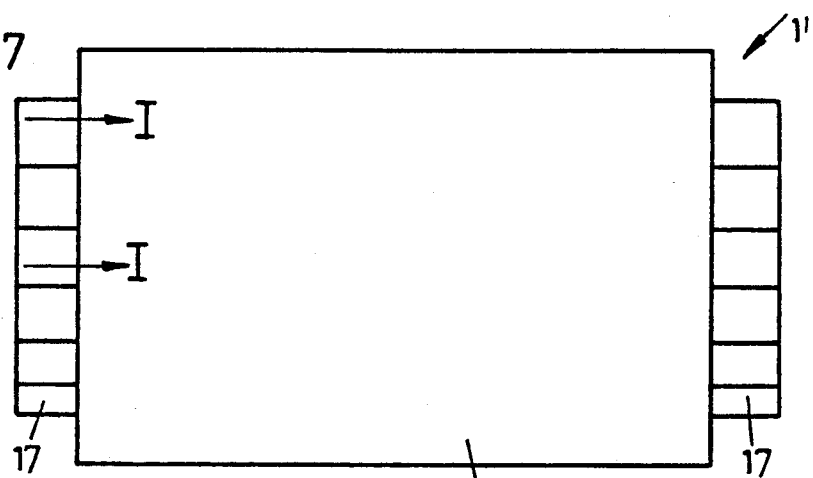
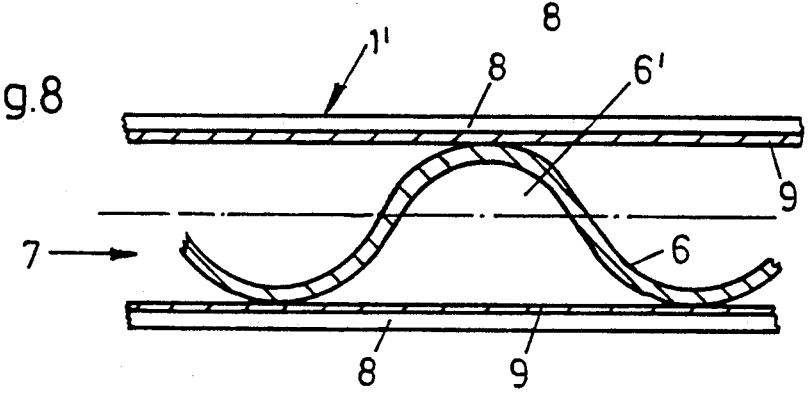
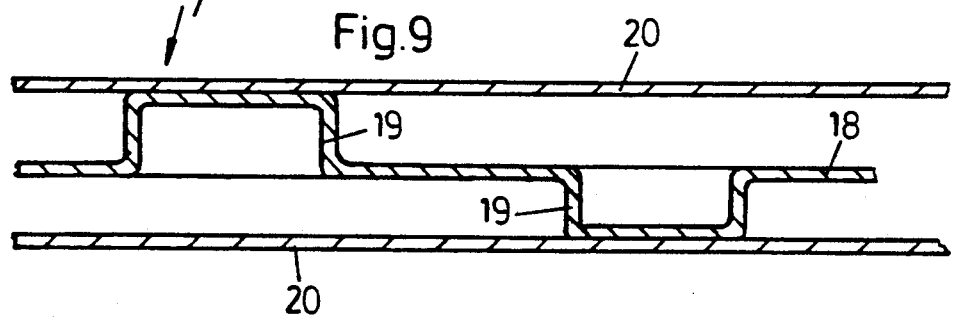
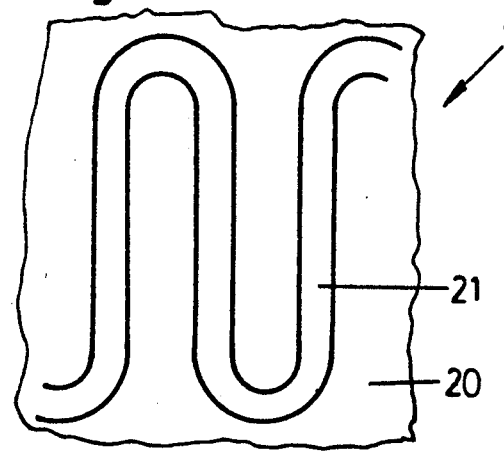
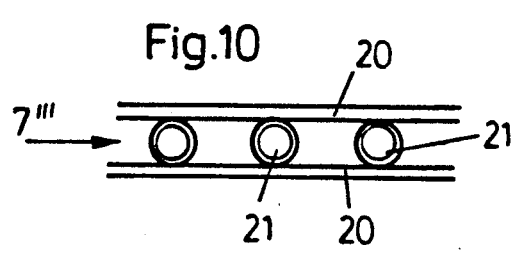

SUBSTRATE, CONSISTING OF COPPER AND CERAMIC LAYERS, FOR PRINTED CIRCUIT BOARDS OF ELECTRICAL CIRCUITS

The invention relates to a substrate, consisting of copper and ceramic layers, corresponding to the generic clause of claim 1.

There is known a multilayered substrate, which is designed particularly for the manufacture of printed circuit boards for heavy-duty electrical circuits (for example, power amplifiers) and is composed of a center layer formed of two blanks of a copper sheet joined together areally and of two ceramic layers, one of which is in each instance provided on each side of the surface of the center layer and likewise joined areally with the center layer, specifically by means of a process which is known as "Direct Bond Copper Technology" and below will be designated as the "DBC method." In this method, the surface of the copper is treated with acid, so that a thin layer of copper oxide is produced there. This copper oxide layer forms a eutectic with a melting temperature below the melting temperature of copper. After treatment of the surface of the particular thin copper sheet forming the copper layer with acid, the latter may be joined with an additional layer, for example, with a ceramic layer formed of a thin ceramic plate or, alternatively, with an additional copper layer, formed of a copper sheet, by heating to the eutectic temperature and by compression of the two layers. In the known substrate, the center layer, formed of the two blanks of copper sheets, serves as a cooling layer which projects at the periphery of the substrate over the remaining layers and is there connected with a frame for carrying off the heat.

In this known multilayered substrate consisting of copper and ceramic layers, it is disadvantageous that, inter alia, with the center layer formed of the two blanks of copper sheet joined together areally, optimal dissipation of the heat due to energy losses of an electrical circuit provided on the substrate is not possible, and that, for cooling of the circuit, the center layer of the substrate must be fastened to the heat-dissipating frame in the aforementioned manner. Thus, when this known substrate is used, it is likewise not possible to accomplish, for example, direct, rapid and effective cooling, especially in the center surface region of the substrate. But with the known substrate it is likewise disadvantageous that, especially when the copper and ceramic layers to be joined together in the DBC method are not completely flat on their surfaces, pinholes, i.e., cavities, which contain air or gas and at which no connection between the adjacent layers exists, are produced between two adjoining layers in the region of the connecting plane there. This is due to, inter alia, the fact that the layer of copper oxide, produced in the DBC method by treatment of the surface of the copper sheet with acid and active as a eutectic, is very thin and therefore, with the DBC method, processes go on within the region of very thin layers.

The object of the invention is to indicate a multilayered substrate, consisting of ceramic and copper layers, which (substrate) has an improved quality with regard to the connection between the separate layers and likewise permits improved cooling.

A substrate wherein a layer sequence is designed as a hollow section in which at least two layers of the layer sequence are provided essentially parallel to one another and at a distance apart is designed to accomplish this object.

In the invention, the separate layers are likewise joined together by the DBC method. The invention has the advantage that, owing to the at least one layer sequence forming a hollow section, a region is obtained between the outer layers of the substrate or the two sides of the surface of the said substrate, which, with the heat treatment likewise necessary in the DBC method, is particularly flexible and so makes it possible for the separate layers to be joined together in the DBC method to contact or to mold to one another appreciably better in this method or with the contact pressure exerted therein on the separate layers. A virtually cavity-free connection, substantially improved in its quality, of not only those layers which form the at least one layer sequence with the hollow section, but of any other possible layers as well, is thus obtained.

In the invention, the copper layers in turn consist of blanks of copper sheet while, for the at least one layer sequence forming the hollow section, a, for example, corrugated copper sheet or one provided on either side with projections or with projecting knobs, or, alternatively, a multiply bent copper tube is used.

Owing to the at least one layer sequence forming the hollow section, the substrate pursuant to the invention has channels in its interior which may in optimal fashion be used for the passage of a cooling medium, for example, cooling air or a cooling liquid, so that rapid and, above all, likewise effective cooling of the center surface zones of the substrate is possible.

Further developments of the invention are the subject matter of the dependent claims.

The invention will be explained below in detail by examples with the aid of the figures, wherein:

FIGS. 1-6 show the layer structure or a section through a variety of substrates according to the invention;

FIG. 7, a top view of a special design of a substrate according to the invention;

FIG. 8, a section along line I—I of FIG. 7;

FIGS. 9 and 10, the layer structure or the section of additional substrates according to the invention;

FIG. 11, in schematic representation and in top view, the layer sequence forming the hollow section forming the substrate of FIG. 10.

With reference to their layer structure, it is common to the embodiments illustrated in FIGS. 1-5 or the substrates 1-5 there that one layer of the substrate 1-5 is a corrugated copper sheet 6 which, with two adjoining layers, forms a layer sequence 7 and, by its corrugation in the interior of the substrate, a hollow section with a plurality of cooling channels 6'. The corrugation of the copper sheet 6 may have a very wide variety of shapes, i.e., this corrugation may be designed sinusoidal, nearly sinusoidal, trapezoidal, triangular, etc. In addition, it is common to the substrates 1-5 that the corrugated copper sheet 6 is in each instance joined in the region of the peaks of this corrugation with the adjoining layers of the substrate.

The thickness of material of the corrugated copper sheet 6 is preferably of the order of magnitude of 0.05-0.5 mm, while the thickness of the other layers of the respective substrate 1-5 and, at the same time, particularly the thickness of any copper layers, is preferably likewise of the same order of magnitude. The corrugation of the corrugated copper layer 6 is preferably designed so that the height h of this corrugation, i.e., the distance apart of two successive opposed peaks in the direction perpendicular to the plane of the corrugated copper sheet 6, as well as the distance apart a of two parallel peaks of the corrugation in the direction of the aforesaid plane stand in a ratio $\sqrt{3/2}$ h/a to one another, V preferably being between 0.1 and 10.

In addition, it is common to all substrates 1-5 of FIGS. 1-5 that all layers there are in each instance joined together by the It is additionally common to all substrates 1-5, represented in FIGS. 1-5, that all layers forming each of these substrates lie parallel to one another and parallel to the plane of the corrugated copper sheet 6.

In the substrate 1 of FIG. 1, the corrugated copper sheet 6 is adjoined on either side by a layer which is formed of a thin ceramic plate 8, which preferably is formed on $Al_2O_3$ ceramic or AlN ceramic.

In the manufacture of a printed circuit board, strip conductors are applied in suitable shape and by known techniques on the side of the surface turned away from the corrugated copper sheet 6 of at least one of the two ceramic layers 8 arranged parallel to one another and at a distance apart or, alternatively, are applied in that a blank of a copper plate forming or holding the strip conductors is applied, specifically, again by the DBC method, on the side of the surface concerned. The substrate 2 of FIG. 2 differs from the substrate 1 essentially only in that, on the side of the surface of one of the ceramic layers 8 of the layer sequence 7 turned away from the corrugated copper sheet 6 there is applied a copper layer 9 formed of a thin copper sheet. This copper layer 9 may then be used, for example, for making strip conductors, preferably with the use of common masking and etching techniques. However, the copper layer 9 may alternatively be used to attach the substrate, provided on its other side on the ceramic layer 8 there with strip conductors and electronic power structural elements, to, for example, a cooling member. The substrate 2 may alternatively be designed so that, instead of the lower ceramic layer 8 in FIG. 2, a copper layer 9 formed of the copper sheet is likewise provided.

Figure 3:
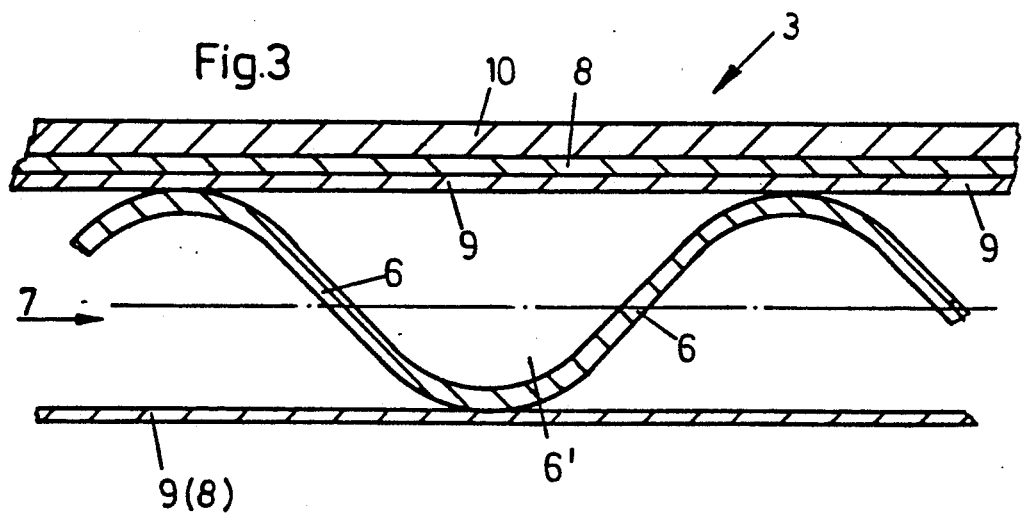

The substrate 3 of FIG. 3 in turn consists of the corrugated copper sheet 6, which is adjoined on both sides by a copper layer 9, in each instance formed of a copper sheet. On the side of the surface of the upper copper layer 9 in FIG. 3 turned away from the corrugated copper sheet 6, the ceramic layer 8 and, on the latter, an additional copper layer 10 is applied, which layer 10 is formed of a copper sheet that has a slightly greater thickness than the copper sheet forming the copper layers 9.

The substrate 4 of FIG. 4 differs from the substrate 3 essentially in that an additional ceramic layer 8 is applied on the lower copper layer in the corrugated representation.

The substrate 5 of FIG. 5 corresponds, with regard to its structure, to the substrate 4, with the difference, however, that the copper layer 10 is again additionally applied on the lowermost ceramic layer 8 in the selected representation, so that the substrate 5, with regard to its layer structure, is completely symmetrical with reference to the plane of the corrugated copper sheet 6.

In the substrates 2-5, it is of course possible to interchange the sequence of ceramic layer 8 and copper layer 9 or 10, so as to adapt the respective substrate to the respective application in optimal fashion.

FIG. 6 shows the structure of a substrate 16 with a layer sequence 7', forming the hollow section, which has two corrugated copper sheets 6 provided with an intermediate layer 11 therebetween. This intermediate layer 11 may be either a ceramic layer 8 or a copper layer 9. On the arrangement formed by the two copper sheets 6 and the intermediate layer 11, two additional layers 12 and 13 are then applied on either side, which together with the copper sheets 6 and the intermediate layer forms the layer sequence 7'. The layer 13 is joined to additional layers 14 and 15. The layer 12 is either a ceramic layer 8 or a copper layer 9. The layers 13-15 are in each instance alternately a ceramic layer 8 and a copper layer 9 or 10.

FIGS. 7 and 8 show a substrate 1', wherein the layer sequence 7 having the hollow section is in turn formed of the corrugated copper sheet 6 and two adjoining layers, preferably of two copper layers 9, and in the embodiment shown a ceramic layer 8 is in each instance applied on the side of the two copper layers 9 turned away from the corrugated copper sheet 6. As FIG. 7 shows, the layer sequence formed of the corrugated copper sheet 6 and the adjoining copper layers 9 projects, at two opposing sides of the substrate 1', having a rectangular blank in the embodiment illustrated, beyond the two ceramic layers 8, so that these projecting regions 17 may serve as connection pieces for connection to a cooling-agent circuit (for example, a circuit for cooling air or a cooling liquid). It is of course alternatively possible for the layer sequence 7 to project beyond the other layers at only one or, otherwise, at more than two sides of the substrate 1'. In addition, instead of the layer sequence 7, the layer sequence 7' may alternatively be used, or the layer structure of the substrate alternatively may differ from the structure shown in FIGS. 7 and 8 on one or, otherwise, on both sides of the layer sequence 7 or 7'.

As an additional further development, FIG. 9 shows the layer sequence 7" forming the hollow section of a substrate otherwise illustrated no further. The layer sequence 7" consists of a copper sheet 18, which on both sides of the surface has a plurality of knobs 19 which project beyond the sides of the said surface. On either side of the copper plate 18 there is in each instance provided a layer 20 which rests on the knobs 19 and in the region of these knobs is joined with the copper plate 18. The two layers 20, arranged parallel to one another and at a distance apart, are each either a ceramic layer or a copper layer. In principle, one layer 20 may alternatively be a ceramic layer and one layer 20 a copper layer. An additional layer, which when the layer 20 is designed as a copper layer is a ceramic layer and when the layer 20 is designed as a ceramic layer is a copper layer, is then preferably applied on at least one of the two layers 20.

FIGS. 10 and 11 show the layer sequence 7''' forming the hollow section of another embodiment which differs from the layer sequence 7" in that between the two layers 20, instead of the copper layer 18, there is provided a copper tube 21, bent serpentine or meanderlike, with which the two layers 20 are joined.

Again in the substrate 1' of FIGS. 7 and 8, as well as in the substrates of FIGS. 9 to 11 having the layer sequences 7" and 7''', the separate layers, including the respective copper sheet 6 and 18, are joined together by the DBC method. In all embodiments described above, the layer sequence 7, 7', 7" and 7''' acts as a flexible substrate layer in the manufacture of the respective substrate, so that the DBC method ensures a uniform bond of the individual layers with high quality and, in particular, without pinholes as well, while the hollow section, or its channels, formed by the layer sequence 7, 7', 7'' or 7'''' may alternatively be used, in especially advantageous fashion, for cooling.

The invention has been described above by examples. It is understood that modifications and variations are possible without departing from the thought underlying the invention. Thus, it is possible, for example, alternatively to manufacture the layer sequence forming the hollow section by using a copper sheet forming a copper layer in which creases forming channels are impressed.

I claim:

1. A multilayered substrate for printed circuit boards of electrical circuits, said substrate consisting of copper and ceramic layers which are joined together by the DBC method into said multilayered substrate, with each copper layer being formed by a copper sheet and each ceramic layer being formed by a ceramic plate, at least two of said layers forming a layer sequence having a hollow section or core, said at least two layers being arranged essentially parallel to each other, said at least two layers being spaced apart from one another by an intermediate spacing layer.

2. The substrate of claim 1 wherein said intermediate spacing layer is formed by at least one corrugated copper sheet.

3. The substrate of claim 1 wherein said intermediate spacing layer is formed by at least one copper sheet having projections on both sides of said sheet.

4. The substrate of claim 3 wherein said projections are knoblike in shape.

5. The substrate of claim 1 wherein said intermediate spacing layer is formed by a multiply bent length of a copper tube.

6. The substrate of claim 5 wherein said copper tube is bent in a serpentine manner.

7. The substrate of claim 1 wherein said intermediate spacing layer is formed by projections which are provided on one side of a surface of at least one of said two layers forming said layer sequence.

8. The substrate of claim 1 wherein said layer sequence has two intermediate spacing layers and an additional flat intermediate layer between said two intermediate spacing layers.

9. The substrate of claim 8 wherein said intermediate spacing layers are each formed of a corrugated copper layer.

10. The substrate of claim 1 wherein at least one of said two layers of said layer sequence is a copper sheet forming a copper layer.

11. The substrate of claim 1 wherein at least one of said two layers of said layer sequence is a ceramic plate forming a ceramic layer.

12. The substrate of claim 1 wherein at least one of said layers of said layer sequence and a further layer joined to said layer of the layer sequence form a pair of flat adjacent layers, with one of said flat adjacent layers being a ceramic layer and with the other of said flat adjacent layers being a copper layer.

13. The substrate of claim 1 wherein at the periphery of the substrate said layer sequence forming said hollow section projects beyond the remaining layers of the substrate.

* * * * *